United States Patent
Yang

(10) Patent No.: US 11,023,019 B2
(45) Date of Patent: Jun. 1, 2021

(54) MOBILE TERMINAL

(71) Applicant: BEIJING XIAOMI MOBILE SOFTWARE CO., LTD., Beijing (CN)

(72) Inventor: Tao Yang, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/741,903

(22) Filed: Jan. 14, 2020

(65) Prior Publication Data

US 2021/0064099 A1    Mar. 4, 2021

(30) Foreign Application Priority Data

Sep. 3, 2019  (CN) .......................... 201910827093.8

(51) Int. Cl.
| | |
|---|---|
| *G06F 1/16* | (2006.01) |
| *H05K 5/03* | (2006.01) |
| *H04N 5/232* | (2006.01) |
| *H04N 5/225* | (2006.01) |

(52) U.S. Cl.
CPC .......... *G06F 1/1686* (2013.01); *G06F 1/1658* (2013.01); *H04N 5/2252* (2013.01); *H04N 5/23296* (2013.01); *H05K 5/03* (2013.01)

(58) Field of Classification Search
CPC ... G06F 1/1686; G06F 1/1658; H04N 5/2252; H04N 5/23296; H05K 5/03
See application file for complete search history.

(56) References Cited

U.S. PATENT DOCUMENTS

| | | | | |
|---|---|---|---|---|
| 5,801,919 A | * | 9/1998 | Griencewic | G06F 1/1686 348/552 |
| 9,686,456 B2 | * | 6/2017 | Wu | H04N 5/2257 |
| 10,021,296 B2 | * | 7/2018 | Fan | H04N 5/2251 |
| 10,656,680 B2 | * | 5/2020 | Fan | G06F 1/1647 |
| 2002/0141147 A1 | * | 10/2002 | Ando | G06F 1/1688 361/679.32 |
| 2007/0253703 A1 | * | 11/2007 | Tsai | H04N 7/142 396/429 |
| 2008/0002965 A1 | * | 1/2008 | Huang | G03B 17/04 396/419 |
| 2008/0123314 A1 | * | 5/2008 | Cheng | G06F 1/1686 361/809 |

(Continued)

FOREIGN PATENT DOCUMENTS

| | | |
|---|---|---|
| CN | 207150657 U | 3/2018 |
| KR | 100824358 B1 | 4/2008 |

OTHER PUBLICATIONS

Extended European Search Report in the European Application No. 20152540.9, dated Jul. 27, 2020, (8p).

*Primary Examiner* — Abhishek M Rathod
(74) *Attorney, Agent, or Firm* — Arch & Lake LLP

(57) ABSTRACT

The present disclosure relates to a mobile terminal. The mobile terminal includes: a body, a lifting component, and a camera. A camera telescoping hole is arranged on the body. The lifting component includes an operating member exposed to outside of the body and a supporting member which is arranged in the body and is in a transmission connection with the operating member. The camera is coupled to the supporting member to extend or retract through the camera telescoping hole when the operating member under action of an external force drives the supporting member.

15 Claims, 5 Drawing Sheets

(56) References Cited

U.S. PATENT DOCUMENTS

| | | | |
|---|---|---|---|
| 2010/0053409 A1 | 3/2010 | Chang | |
| 2011/0274422 A1 | 11/2011 | Lin | |
| 2013/0163170 A1* | 6/2013 | Chen | G03B 29/00 |
| | | | 361/679.4 |
| 2014/0302705 A1* | 10/2014 | Park | H01R 12/714 |
| | | | 439/374 |
| 2016/0205293 A1* | 7/2016 | Jung | H04N 5/2252 |
| | | | 348/373 |
| 2017/0064166 A1* | 3/2017 | Xiong | H04M 1/0264 |
| 2017/0244903 A1* | 8/2017 | Yang | H04N 5/23216 |

* cited by examiner

MOBILE TERMINAL

CROSS-REFERENCE TO RELATED APPLICATIONS

The present application claims priority to Chinese Patent Application No. 201910827093.8, filed on Sep. 3, 2019, the disclosure of which is hereby incorporated by reference in its entirety.

TECHNICAL FIELD

The present disclosure relates to the technical field of mobile terminals, and more particularly to a mobile terminal including a telescoping camera.

BACKGROUND

With the development of mobile terminals, a full screen and a rear cover without holes or obstructions have become a desirable design trend for mobile terminals. However, for the mobile terminal provided with a camera, a light transmission hole that aligns with the camera is required to be arranged on the display screen or the rear cover plate. In this case, how to provide the desirable design while ensuring the normal use of the camera in the mobile terminal becomes a technical problem to solve.

SUMMARY

A mobile terminal is provided in the present disclosure to overcome defects in a related art.

According to an aspect of the present disclosure, a mobile terminal is provided, which may include a body, a lifting component and a camera. A camera telescoping hole is arranged on the body. The lifting component includes an operating member exposed to outside of the body, and a supporting member which is arranged in the body and is in a transmission connection with the operating member. The camera is coupled to the supporting member to extend or retract through the camera telescoping hole when the operating member under action of an external force drives the supporting member.

It is to be understood that the above general descriptions and detailed descriptions below are only exemplary and explanatory, rather than limiting the present disclosure.

BRIEF DESCRIPTION OF THE DRAWINGS

The accompanying drawings, which are incorporated into the specification and constitute a part of the specification, illustrate embodiments consistent with the present disclosure and, along with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise stated. The implementations set forth in the following description of exemplary embodiments do not represent all implementations consistent with the present disclosure. Instead, the disclosed implementations are provided merely as examples of apparatuses and methods consistent with aspects related to the present disclosure and as recited in the appended claims.

In some embodiments, the photography function may be implemented without a light transmission hole positioned in either a display panel and/or a rear cover plate utilizing an electric motor to eject a camera module. Specifically, the electric motor is mounted in a body of a mobile terminal to enable the camera to eject from or retract into the body. However, utilizing an electric motor increases the complexity of the mobile terminal, may require maintenance and replacement of the electric motor, and may increase the overall cost of the mobile terminal.

An exemplary mobile terminal is disclosed according to the embodiments discussed herein. FIG. 1 to FIG. 8 are illustrations of a mobile terminal provided according to the present embodiment. In each of the accompanying drawings, a mobile phone is utilized as an example of photography functionality implemented without a light transmission hole. The mobile terminal provided by the embodiments of the present disclosure may be a mobile phone, a tablet PC, a wearable device or a medical device.

Figure 1:
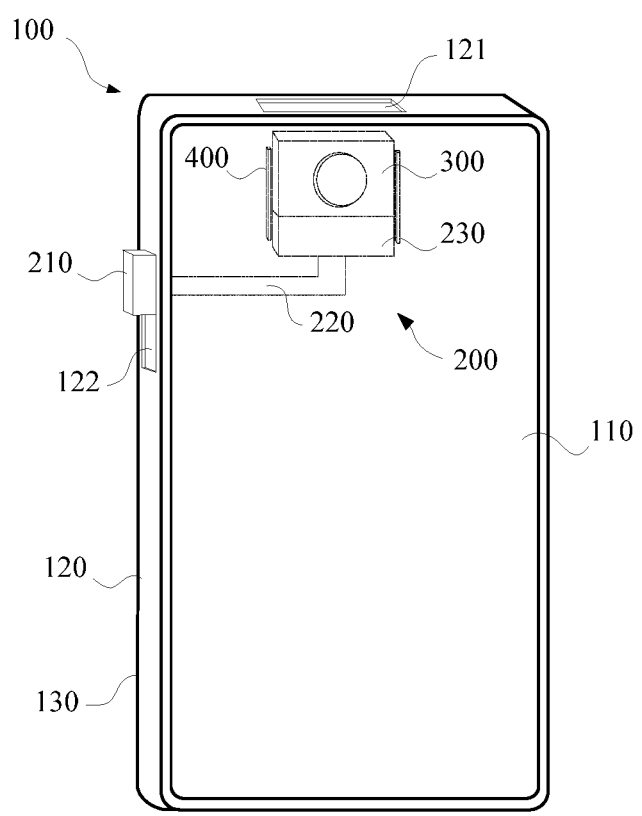
FIG. 1 illustrates a mobile terminal according to an example.

As shown in FIG. 1, the mobile terminal provided by the embodiments of the present disclosure may include a body 100, a lifting component 200, and a camera module 300.

The body 100 may include a display panel 110, a side edge 120, and a rear cover 130. The display panel 110 and the rear cover 130 are arranged oppositely and connected with the side edge 120. In some embodiments, the rear cover 130 and the side edge 120 may be integrally formed into a single structure. Accordingly, an inner cavity of the body 100 may be formed by means of the display panel 110, the side edge 120 and the rear cover 130, to mount functional modules (such as, for example, a battery, a loudspeaker, a microphone, and a camera module) within the mobile terminal.

A camera telescoping hole 121 is arranged on the body 100, so that the camera module extends from or retracts into the inside of the body 100. In addition, a mounting hole 122 which provides a connection between the inside of the body 100 and the outside of the body 100 is formed within the side edge 120. The mounting hole 122 cooperates with the lifting component 200. Optionally, the camera telescoping hole 121 and the mounting hole 122 are arranged on different sides of the side edge 120. For example, the camera telescoping hole 121 is arranged on a broad side of the side edge 120, and the mounting hole 122 is arranged on a long side of the side edge 120.

The example lifting component 200 includes an operating member 210 mounted positioned within the mounting hole 122 and extending to outside of the body 100. A portion of the operating member 210 extends to outside of the body 100 may be driven by an external force (for example, the operating member is pushed by a user). The lifting component 200 may further include a transmission member 220 carried within the body 100. The transmission member 220 is coupled to the operating member 210.

The lifting component 200 may further include a supporting member 230 carried within the body 100. The supporting member 230 bears the camera module 300 as a front camera module. Optionally, the supporting member 230 is a protective casing in a frame structure for mounting the camera module 300. Optionally, the supporting member 230 is a support platform for bearing the camera module 300.

In an example, the supporting member 230 is in a rotational connection with the camera module 300. For example, the supporting member 230 is rotationally connected with the camera module 300 through a bearing. In such a way, the camera module 300 may rotate relative to the supporting member 230.

The camera module 300 can, for example, at least rotate between a front photographing position and a rear photographing position. Optionally, the camera module 300 is driven manually by the user to rotate between the front photographing position and the rear photographing position. Alternatively, the camera module 300 is driven by a rotary driving member that rotates between the front photographing position and the rear photographing position (for example, the rotary driving member is also mounted on the supporting member 230, and synchronously moves along with the supporting member 230).

In addition, the supporting member 230 is connected with the transmission member 220. In use, an external force is applied to a portion of the operating member 210 outside the body 100, the operating member 210 drives the transmission member 220, and the transmission member 220 then drives the supporting member 230 to enable the camera module 300 to eject from or retract into the body 100.

In such a way, a controllable portion is provided for the user by the operating member 210 of the lifting component 200. Then, when the operating member 210 is driven by an external force, the supporting member 230 coupled to the transmission member 220 drives the camera module 300 to extend out of the body 100 to allow for photography. In this way, a light transmission hole matching with the camera module 300 need not be formed into the display panel 110 or the rear cover plate 130. In addition, an electric motor for driving the lifting component 200 is not required to overcomes the issues noted in the related art of complex structure and difficulty in maintaining and replacing the electric motor, and realizes a photographing function of the mobile terminal while having a full-screen display effect or a complete rear cover plate.

Furthermore, after the camera module 300 extending from the body 100, the camera module 300 can be driven to rotate relative to the supporting member 230, and thus the camera module 300 can be in a front photographing state and a rear photographing state. In such a way, the camera module 300 has both a front photographing function and a rear photographing function. Therefore, the light transmission hole is not required to be formed in each of the display panel 110 and the rear cover plate 130, thereby improving the effect and appearance of the mobile terminal.

In addition, in an embodiment, a limiting member 400, for example a linear moving track, is arranged in the body 100. In this way, the supporting member 230 and the camera module 300 move along the limiting member 400 in the body 100. After ejecting from the body 100, the camera module 300 is not defined by the limiting member 400, and can rotate between the front photographing position and the rear photographing position.

In an embodiment, as shown in FIG. 1, the operating member 210 is in a sliding connection with the body 100. Specifically, a longitudinal direction of the mounting hole 122 is arranged along the direction of travel as the camera module 300 extends or retracts, and the operating member 210 slides relative to the body 100 along the length direction of the mounting hole 122.

Figure 2:
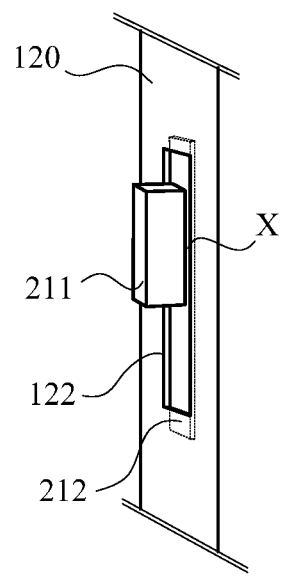
FIG. 2 illustrates an operating member in a lifting component of a mobile terminal according to an example.

As shown in FIG. 2, the operating member 210 may include a force-bearing portion 211, and a connection portion 212 connected with the force-bearing portion 211.

The force-bearing portion 211 is arranged in the mounting hole 122, and the length of the force-bearing portion 211 is less than the length of the mounting hole 122. In this configuration, the force-bearing portion 211 can move longitudinally within the mounting hole 122. A structure of the force-bearing portion 211 includes, but is not limited to, a sheet structure, a block structure, and a columnar structure. In an embodiment, a gap X between a length edge of the force-bearing portion 211 and a length edge of the mounting hole 122 is less than or equal to 0.5 mm, and accordingly the appearance of the mobile terminal optimized while ensuring that the force-bearing portion 211 may move along the mounting hole 122.

Figure 3:
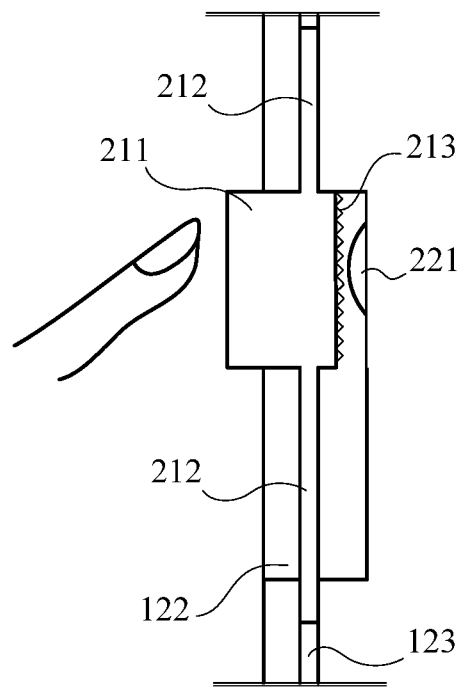
FIG. 3 illustrates an operating member in a lifting component of a mobile terminal according to another example.

As shown in FIG. 3, slots 123 may be arranged on the body 100. Optionally, the slots 123 may be arranged on a side, facing the inside of the body 100, of the side edge 120. In addition, the slots 123 may be arranged adjacent to the mounting hole 122. For example, the force-bearing portion 211 moves within the mounting hole 122, the slots 123 may be arranged on opposite sides of the mounting hole 122 (taking FIG. 3 as an example, the slots 123 are arranged on opposite sides, in the length direction, of the mounting hole 122).

Furthermore, the connection portions 212 are arranged in the body 100 and connected with the force-bearing portion 211. For example, the connection portions 212 are arranged on opposite sides along a movement direction of the force-bearing portion 211 within the mounting hole 122 (taking FIG. 3 as an example, the connection portions 212 are arranged on the opposite sides in a length direction of the mounting hole 122). In addition, the connection portion 212 is plugged into the slot 123 in a manner allowing the connection portion to be slidable with respect to the slots. In this exemplary way, the operating member 210 may slide relative to the body 100 by flexibly plugging the connection portions 212 into the slots 123. In addition, when the force-bearing portion 211 moves, the connection portion 212 on one side of the force-bearing portion 211 further extends into the slot 123, and the connection portion 212 on the other side of the force-bearing portion 211 extends out from the slot 123.

In addition, the length of the connection portion 212 on either side of the force-bearing portion 211 is greater than a maximum moving distance of the force-bearing portion 211 in the mounting hole 122. In such a way, in a process that the force-bearing portion 211 moves along the mounting hole 122, the connection portion 212 is always plugged into the slot 123, which can cover the mounting hole 122. Preferably, the width of the connection portion 212 is greater than or equal to the width of the mounting hole 122, so as to ensure that the connection portion 212 covers the mounting hole 122, prevent the inner cavity of the body 100 from being exposed to the outside, and optimizing the dust-proof and impurity-proof performance of the mobile terminal.

In addition, in a direction towards the outside of the body 100, the force-bearing portion 211 is arranged to protrude outside of the connection portion 212. In such a way, it is convenient for the user during use to apply a force to the force-bearing portion 211 to push the operating member 210, thereby optimizing user experience.

In an embodiment, as shown in FIG. 1 and FIG. 3, a first transmission structure 213 is arranged on a side, facing the inside of the body 100, of the operating member 210. For example, the first transmission structure 213 is arranged on a side, facing the inside of the body 100, of the force-bearing portion 211. The first transmission structure 213 is configured to be in cooperation with the transmission member 220, so that the operating member 210 drives the supporting member 230 in a transmission mode.

The transmission member 220 can cooperate with the supporting member 230 in various configurations as described below according to specific circumstances.

As an example, the transmission member 220 is fixedly connected with the supporting member 230. Here, the fixed connection means that the transmission member 220 and the supporting member 230 cannot move relative to each other when the supporting member 230 and the transmission member 220 are connected, but it is not limited whether the transmission member 220 is detachably connected with the supporting member 230. For example, the transmission member 220 and the supporting member 230 are connected through a connector or are integrally formed.

Figure 4:
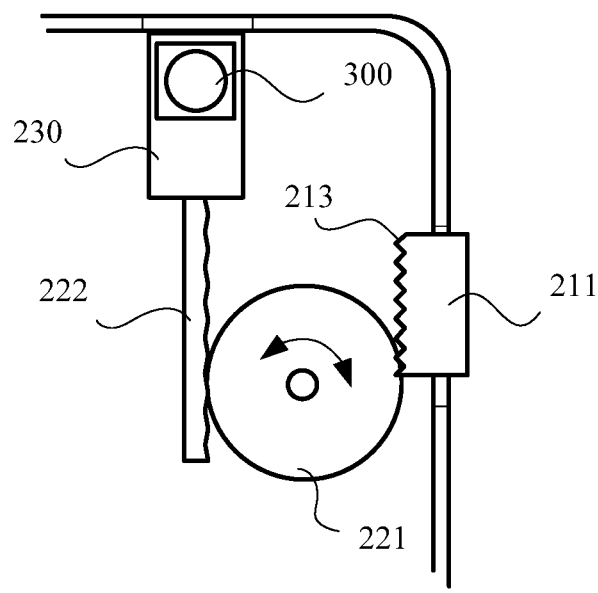
FIG. 4 illustrates a transmission member in a mobile terminal according to an example.

In this case, as shown in FIG. 4, the transmission member 220 includes a first transmission member 221 in cooperation with the first transmission structure 213. The first transmission member 221 under driving of the force-bearing portion 211 rotates around a first axis. Here, the first axis extends orthogonally relative to the surface of the display panel 110 mounted within the body 100.

The transmission member 220 may further include a second transmission member 222 in cooperation with the first transmission member 221. The second transmission member 222 is in cooperation with the first transmission member 221 in a transmission mode, and under driving of the first transmission member 221, moves along a direction orthogonal to the first axis (namely along a direction extending to the camera telescoping hole 121). In addition, the second transmission member 222 is fixedly connected with the supporting member 230, so that the second transmission member 222 moves along a direction orthogonal to the first axis under driving of the first transmission member 221.

For example, the first transmission structure 213 is in an engaging tooth structure arranged on the force-bearing portion 211 and facing the inside of the body 100. The first transmission member 221 is a gear or pinion engaged with the first transmission structure 213. The second transmission member 222 is a rack fixedly connected with the supporting member 230, and the second transmission member 222 is engaged with the first structural member 221.

In such a way, with taking an orientation shown in FIG. 4 as an example, a usage process of the lifting component 200 is described as follow.

When the force-bearing portion 211 moves downward under action of a force, the first transmission member 221 rotates clockwise, and the second transmission member 222 is driven to move upward to enable the camera module 300 to extend through the camera telescoping hole 121.

When the force-bearing portion 211 moves upward under action of a force, the first transmission member 221 rotates counterclockwise, and the second transmission member 222 is driven to move downward to enable the camera module 300 to retract through the camera telescoping hole 121.

As an example, the transmission member 220 is in a transmission connection with the supporting member 230. For example, a second transmission structure 231 cooperating with the driving member 220 in a transmission mode is arranged on the supporting member 230.

Figure 5:
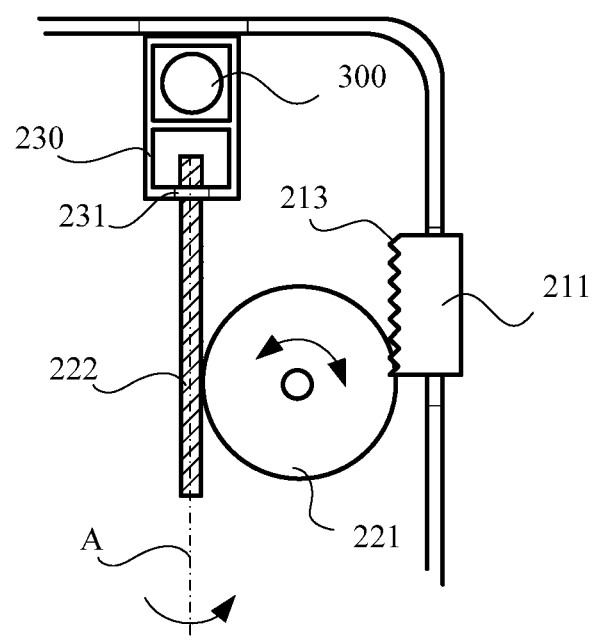
FIG. 5 illustrates a transmission member in a mobile terminal according to another example.

In this case, as shown in FIG. 5, the transmission member 220 includes the first transmission member 221 cooperating with the first transmission structure 213. The first transmission member 221 rotates around the first axis under driving of the operating member 210. Here, the first axis is orthogonal to the surface of the display panel 110 mounted within the body 100.

The transmission member 220 may further include the second transmission member 222 cooperating with the first transmission member 221. The second transmission member 222 cooperates with the first transmission member 221 in a transmission mode, and rotates around a second axis A under driving of the first transmission member 221. Here, the second axis A is orthogonal to the first axis. In addition, the second transmission member 222 also cooperates with the second transmission structure 231 to drive the supporting member 230 to move along the second axis A.

For example, the first transmission structure 213 is in an engaging tooth structure arranged on the force-bearing portion 211 and facing the inside of the body 100. The first transmission member 221 is a worm gear engaged with the first transmission structure 213. The second transmission member 222 is a worm shaft engaged with the worm gear. The second transmission structure 231 on the supporting member 230 is an internal threaded hole. The second transmission member 222 is also in threaded transmission connection with the second transmission structure 231. In addition, a limiting member is arranged in the body 100 to define rotation of the supporting member 230 and define the supporting member 230 to rotate only along the second axis.

In such a way, with taking the orientation shown in FIG. 5 as an example, a usage process of the lifting component 200 is described as follows.

When the force-bearing portion 211 moves downward under action of a force, the first transmission member 221 rotates clockwise, and the second transmission member 222 is driven to rotate around the second axis A. In this way, the supporting member 230 extends from the inside of the body 100 through the camera telescoping hole 121 under driving of the second transmission member 222 and under a limiting action of the limiting member.

When the force-bearing portion 211 moves upward under action of a force, the first transmission member 221 rotates counterclockwise, and the second transmission member 222 is driven to rotate around the second axis A. In this way, the supporting member 230 retracts into the camera telescoping hole 121 from the outside of the body 100 under driving of the second transmission member 222 and under a defining action of the limiting member.

Figure 6:
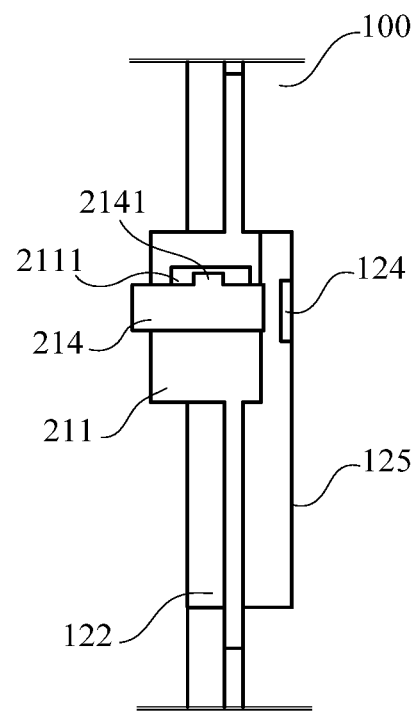
FIG. 6 illustrates an operating member in a lifting component of a mobile terminal according to another example.

In addition, in an embodiment, as shown in FIG. 6, the operating member 210 may further include a key 214 arranged on the force-bearing portion 211. The key 214 is pressed to move towards the inside of the body 100. For example, in a direction vertical to the mounting hole 122, the key 214 is arranged to pass through the force-bearing portion 211. Preferably, an end, facing the outside of the body 100, of the key 214 protrudes out of the force-bearing portion 211, for facilitating the user to press.

Furthermore, a limiting slot 2111 is arranged in the force-bearing portion 211, and a limiting key 2141 is arranged on a side wall of the key 214. The limiting key 2141 is plugged into the limiting slot 2111, and may move along the limiting slot 2111.

Figure 7:
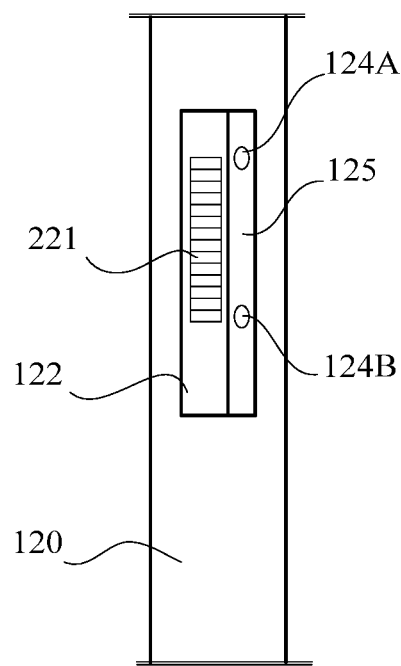
FIG. 7 illustrates a mounting hole in a mobile terminal according to an example.

A contact point 124 is arranged in the body 100. For example, as shown in FIG. 1 and FIG. 7, a mounting plate 125 facing the mounting hole 122 is arranged in the body 100, and the contact point 124 is arranged on the mounting plate 125. The contact point 124 cooperates with the key 214. Specifically, the key 214 is pressed to move towards the inside of the body 100, and contacts with the contact point 124 to send a signal.

In addition, the width of the mounting plate 125 is less than the width of the mounting hole 122, so that the first transmission structure 213 can pass through the mounting hole 122 to cooperate with the first transmission member 221 in the body 100. For example, the contact point 124 may include or incorporate an elastic switch sheet. The elastic switch sheet is an elastic switch component and arranged on a circuit board. In an untriggered state, the elastic switch sheet arches and does not contact with the circuit board. In a triggered state, the elastic switch sheet is pressed to contact with the circuit board to trigger a signal. In the embodiments of the present disclosure, the circuit board is optionally arranged on the mounting plate 125.

Figure 8:
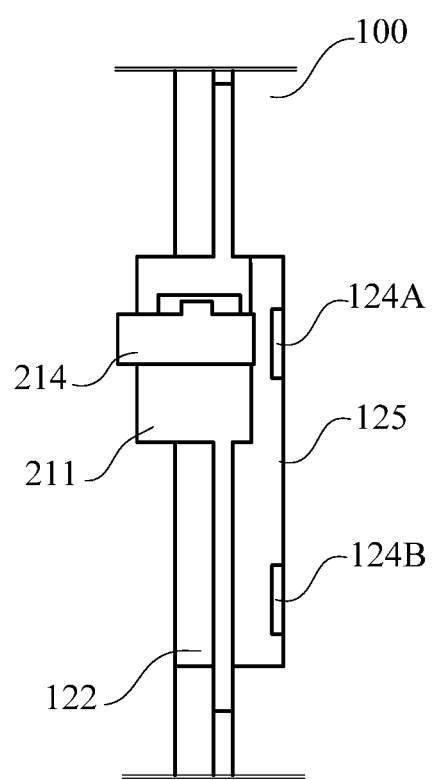
FIG. 8 illustrates an operating member in a lifting component of a mobile terminal according to another example.

Furthermore, as shown in FIG. 8, the contact points 124 include a first contact point 124A and a second contact point 124B arranged along a movement direction of the operating member 210. For example, when the operating member 210 moves to a position where the key 214 cooperates with the first contact point 124A, the camera module 300 extends through the camera telescoping hole 121. When the operating member 210 moves to a position where the key 214 cooperates with the second contact point 124B, the camera module 300 retracts through the camera telescoping hole 121.

In such a way, the operating member 210 also has a key triggering function. In addition, the operating member 210 has two triggering positions through the first contact point 124A and the second contact point 124B. Therefore, no matter whether the camera module 300 ejects from the body 100 or retracts into the body 100, the operating member 210 can realize a key function. In such a way, it is not necessary to open a hole on the body 100 to mount the key, which optimizes the structure stability of the body 100 and beautifies the appearance.

In addition, in the embodiments of the present disclosure, a lens of the camera module 300 includes, but is not limited to, a telephoto camera, a wide-angle camera, a fish-eye lens, and a micro lens. In addition, optionally, the camera module includes at least one lens to achieve multiple photographing effects. When the camera module 300 includes multiple cameras, an arrangement mode of the multiple cameras is not limited. For example, the multiple cameras are arranged in a straight line, or in a triangle.

Other implementation solutions of the present disclosure will be apparent to those skilled in the art from consideration of the specification and practice of the present disclosure. This disclosure is intended to cover any variations, uses, or adaptations of the present disclosure following the general principles thereof and including such departures from the present disclosure as come within known or customary practice in the art. It is intended that the specification and examples are considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only is limited by the appended claims.

What is claimed is:

1. A mobile terminal comprising:
a body, wherein the body includes a camera telescoping hole and a mounting hole arranged on the body;
a lifting component comprising an operating member exposed to outside of the body and a supporting member arranged inside the body, wherein the supporting member is coupled to the operating member; and
a camera coupled to the supporting member, wherein the camera is configured to extend or retract through the camera telescoping hole when the operating member under action of an external force drives the supporting member,
wherein the operating member comprises a force-bearing portion arranged in the mounting hole to slide along the mounting hole under action of the external force;
wherein the operating member further comprises a key arranged on the force-bearing portion, the key is pressed to move towards the inside of the body;
wherein a contact point is arranged in the body, and the key is pressed to contact with the contact point to send a signal, and
wherein a mounting plate facing the mounting hole is arranged in the body, width of the mounting plate is less than width of the mounting hole, and the contact point is arranged on the mounting plate.

2. The mobile terminal of claim 1, wherein the operating member extends to the outside of the body from the mounting hole; and
wherein the operating member is in a sliding connection with the body, and the operating member slides relative to the body so as to drive the supporting member to eject or retract together with the camera.

3. The mobile terminal of claim 2, wherein one or more slots are arranged on the body, the operating member comprises:
one or more connection portions arranged in the body and connected with the force-bearing portion;
wherein the connection portions are plugged into the slots in a manner that the connection portions are slidable with respect to the slots.

4. The mobile terminal of claim 3, wherein a length of the force-bearing portion is less than a length of the mounting hole.

5. The mobile terminal of claim 3, wherein in a direction where the force-bearing portion moves along the mounting hole, the connection portions are arranged on opposite sides of the force-bearing portion, and the slots are arranged on opposite sides of the mounting hole,
length of the connection portion on either side of the force-bearing portion is greater than a maximum moving distance of the force-bearing portion in the mounting hole.

6. The mobile terminal of claim 5, wherein the contact point comprises a first contact point and a second contact point arranged along a movement direction of the operating member.

7. The mobile terminal of claim 6, wherein when the operating member moves to a position where the key cooperates with the first contact point, the camera ejects through the camera telescoping hole; and when the operating member moves to a position where the key cooperates with the second contact point, the camera retracts through the camera telescoping hole.

8. The mobile terminal of claim 2, wherein a first transmission structure is arranged on a side, facing inside of the body, of the operating member, the lifting component further comprises a transmission member arranged in the body, and the transmission member is connected with the supporting member, and is in transmission cooperation with the first transmission structure.

9. The mobile terminal of claim 8, wherein the transmission member comprises: a first transmission member, which is in cooperation with the first transmission structure, and is driven by the operating member to rotate along a first axis; and a second transmission member, which is fixedly connected with the supporting member, is in transmission cooperation with the first transmission member, and driven by the first transmission member to move along a direction orthogonal to the first axis.

10. The mobile terminal of claim 9, wherein the first transmission structure is in an engaging tooth structure arranged on the force-bearing portion and facing the inside of the body, the first transmission member is a gear engaged with the first transmission structure, and the second transmission member is a rack fixedly connected with the supporting member, and the second transmission member is engaged with the first structural member.

11. The mobile terminal of claim 8, wherein a second transmission structure is arranged on the supporting member, the transmission member comprises: a first transmission member, which is in cooperation with the first transmission structure, and driven by the operating member to rotate along a first axis; and a second transmission member, which is in cooperation with the first transmission member, and is driven by the first transmission member to rotate along a second axis, with the second axis being orthogonal to the first axis, wherein the second transmission member is in cooperation with the second transmission structure to drive the supporting member to move along the second axis.

12. The mobile terminal of claim 11, wherein the first transmission structure is in an engaging tooth structure arranged on the force-bearing portion and facing the inside of the body, the first transmission member is a worm gear engaged with the first transmission structure, the second transmission member is a worm shaft engaged with the worm gear, the second transmission structure on the supporting member is an internal threaded hole, and the second transmission member is also in threaded transmission connection with the second transmission structure.

13. The mobile terminal of claim 1, wherein the camera is in a rotational connection with the supporting member, so as to rotate after the camera ejects from the body.

14. The mobile terminal of claim 13, wherein the camera at least rotates between a front photographing position and a rear photographing position.

15. The mobile terminal of claim 13, wherein a limiting member in cooperation with the camera is arranged in the body, so as to define rotation of the camera and the supporting member relative to each other in the body.

* * * * *